US006791879B1

(12) United States Patent
Adkins

(10) Patent No.: US 6,791,879 B1
(45) Date of Patent: Sep. 14, 2004

(54) STRUCTURE AND METHOD FOR PROGRAMMABLE AND NON-VOLATILE ANALOG SIGNAL STORAGE FOR A PRECISION VOLTAGE REFERENCE

(75) Inventor: Kenneth C. Adkins, Fremont, CA (US)

(73) Assignee: Summit Microelectronics, Inc., San Jose, CA (US)

( * ) Notice: Subject to any disclaimer, the term of this patent is extended or adjusted under 35 U.S.C. 154(b) by 0 days.

(21) Appl. No.: 10/252,891

(22) Filed: Sep. 23, 2002

(51) Int. Cl.[7] .............................................. G11C 11/34

(52) U.S. Cl. .................................. 365/185.21; 365/207

(58) Field of Search ............................ 365/185.21, 207

(56) References Cited

U.S. PATENT DOCUMENTS 6,466,482 B2 * 10/2002 Shukuri et al. ......... 365/185.24

* cited by examiner

Primary Examiner—M. Tran
(74) Attorney, Agent, or Firm—Fernandez & Associates LLP

(57) ABSTRACT

A programmable and non-volatile analog signal storage structure and method are disclosed that employ two non-volatile cells which are arranged as a differential transistor pair. The non-volatile transistor at the positive (or non-inverting) terminal of the amplifier is referred to as the reference cell, while the non-volatile transistor on the negative (or inverting) input of the amplifier is referred to as the storage cell. The structure comprises a storage cell and a reference cell that produces a voltage which is independent of temperature and supply voltage variation. Additionally, the circuit structure is capable of operating at low supply voltage levels (<1.5V).

12 Claims, 4 Drawing Sheets

STRUCTURE AND METHOD FOR PROGRAMMABLE AND NON-VOLATILE ANALOG SIGNAL STORAGE FOR A PRECISION VOLTAGE REFERENCE

BACKGROUND INFORMATION

1. Field of the Invention

The invention relates generally to integrated circuits, more particularly to storage of analog signals.

2. Description of Related Art

In the field of non-volatile analog signal storage, one focus of existing solutions has been on high-density storage, such as arrays of cells. Another focus of existing solutions has been in the area of high-speed programming algorithms. The objective in both instances is to provide techniques useful for commercial memory products that compete against traditional types of digital memories, such as EPROM's, EEPROM's and FLASH memories, which are extremely dense and may be programmed in a very straight-forward manner. Consequently, the conventional cells are not optimized for extremely high accuracy, especially over time varying conditions such as power supply and temperature fluctuations.

Conventional solutions in the field of voltage references focus mainly on bandgap designs or shunt regulators using zener diodes. However, both of these techniques have fundamental limitations with regard to temperature performance. Moreover, both have difficulty working at very low power supply levels (<1.5V).

Accordingly, it is desirable to have a structure and method for providing a non-volatile analog signal storage for a precision voltage reference.

SUMMARY OF THE INVENTION

The invention discloses a programmable and non-volatile analog signal storage structure and method that employ two non-volatile cells which are arranged as a differential transistor pair. The non-volatile transistor at the positive (or non-inverting) terminal of the amplifier is referred to as the reference cell, while the non-volatile transistor on the negative (or inverting) input of the amplifier is referred to as the storage cell. The structure comprises an analog storage unit that produces a voltage that is independent of temperature and supply voltage variation. Additionally, the circuit structure is capable of operating at low supply voltage levels (<1.5V).

An integrated circuit for storing analog signals comprises a differential amplifier configuration including a storage unit having: a NV (non-volatile) storage cell (M3); and a NV (non-volatile) reference cell (M4), coupled to the NV storage cell, wherein the NV storage cell and the NV reference cell form a differential pair in the differential amplifier configuration.

Advantageously, the present invention attains a high degree of accuracy in a non-volatile analog storage medium, such as EEPROM.

This summary does not purport to define the invention. The invention is defined by the claims.

DETAILED DESCRIPTION OF PREFERRED EMBODIMENT(S)

Figure 1A:
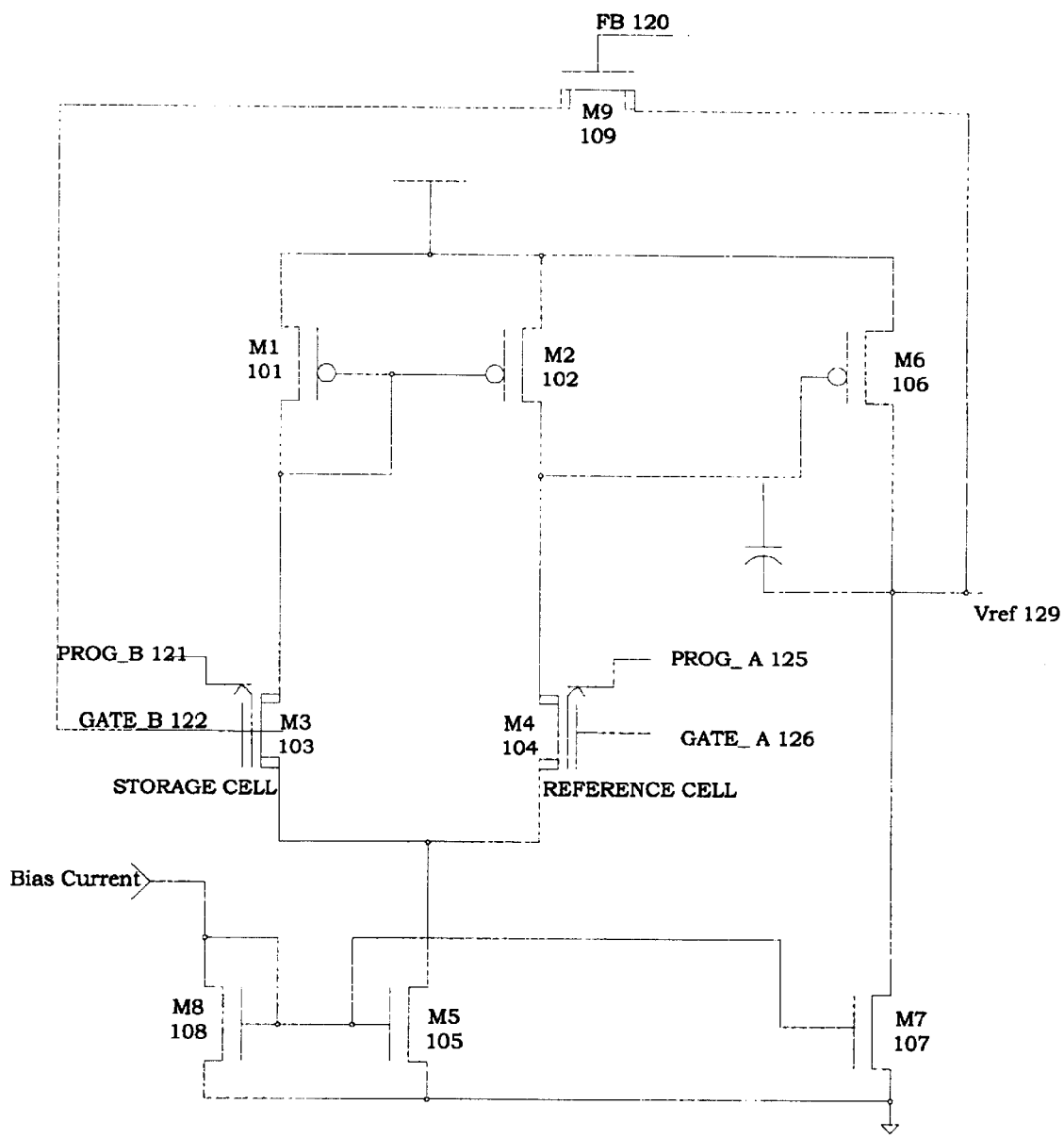
FIG. 1A is a schematic diagram illustrating a non-volatile analog signal storage system for a precision voltage reference with a unity gain feedback amplifier configuration in accordance with the present invention.

FIG. 1A is a schematic diagram illustrating a non-volatile analog signal storage system 100 for a precision voltage reference with a unity gain feedback amplifier configuration. The non-volatile analog signal storage system 100 is constructed with a differential amplifier configuration that employs $E^2$ (electrical erasable) cells. A storage cell M3 103 and a reference cell 104 form the differential pair of the amplifier. Both the storage cell M3 103 and the reference cell 104 are implemented with $E^2$ cells. Transistors M1 101, M2 102, and M5 105 operate as part of the input stage by providing biasing for the differential pair M3 103 and M4 104. Transistors M6 106 and M7 107 represent the output stage of the differential amplifier. A transistor M8 108 sets a bias voltage based on input current, while a transistor M9 109 is used to provide negative feedback for the amplifier.

The storage cell M3 103 has a PROG_B 121 node and a GATE_B node 122, while the reference cell M4 104 has a PROG_A 125 node and a GATE_A node 126. The Vref 129 is the constant reference output of the circuit.

The non-volatile analog signal storage system 100 allows a continuous readout of the stored analog voltage when the amplifier is placed into a unity gain configuration. Such a configuration is accomplished by connecting the output of the amplifier to its inverting input (gate of the storage cell). The nature of the feedback in this configuration forces the output voltage to be proportional to the difference in charge between the storage cell and the reference cell. The unity gain configuration in FIG. 1A is achieved by holding a FB signal 120 at the positive rail, thereby allowing M9 109 to conduct. For proper readout, GATE_A and the two programming nodes (PROG_A and PROG_B) should be grounded.

Figure 1B:
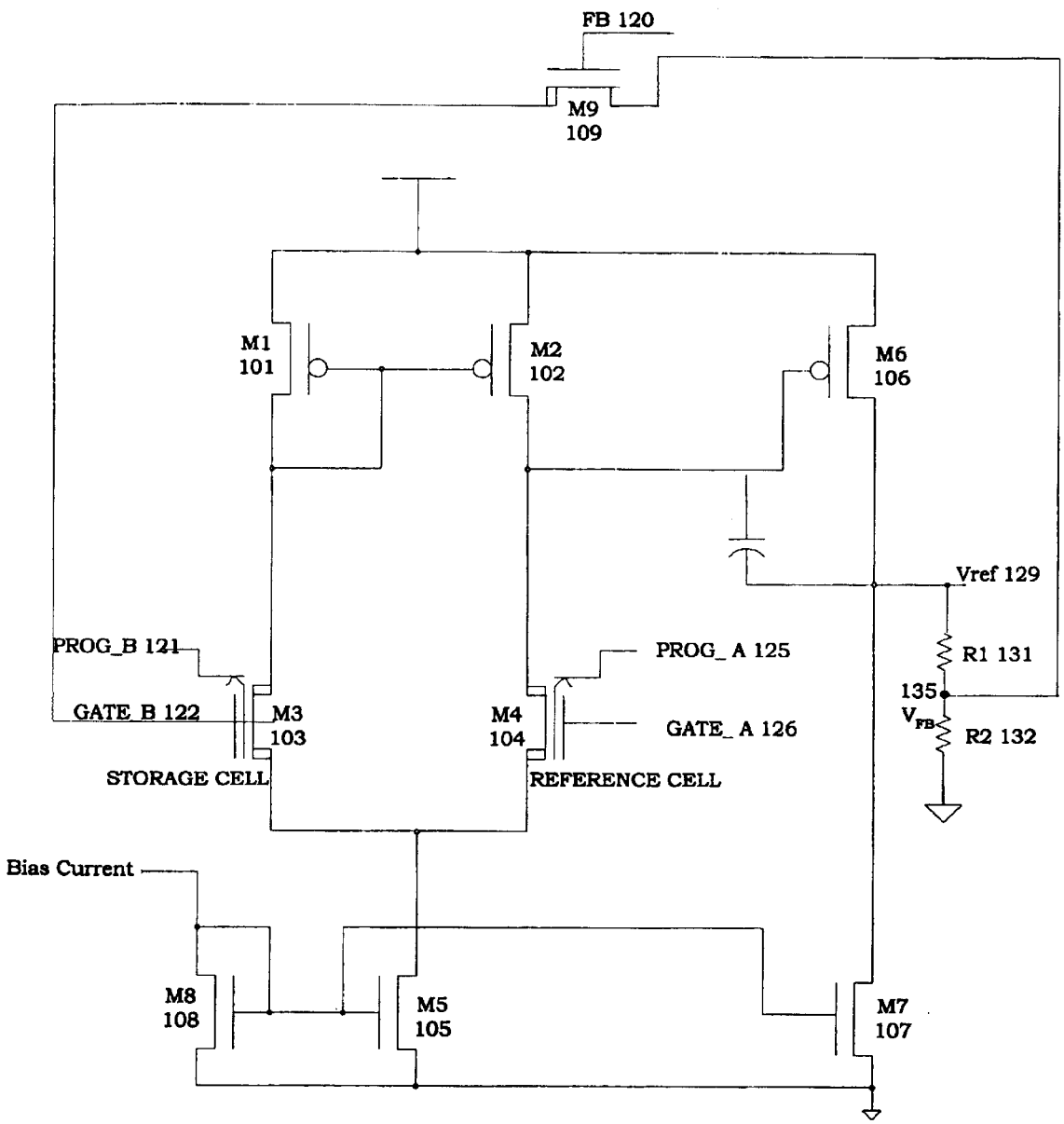
FIG. 1B is a schematic diagram illustrating a non-volatile analog signal storage system for a precision voltage reference in a common non-inverting amplifier configuration in accordance with the present invention.

The unity gain feedback configuration as shown in FIG. 1A represents one instantiation of a negative feedback configuration. FIG. 1B is a schematic diagram illustrating a non-volatile analog signal storage system 130 for a precision voltage reference in a common non-inverting amplifier configuration. In this configuration, the reference output voltage, Vref 129, is connected through two series resistors R1 131 and R2 132 to ground. A point 135 in between the two resistors R1 131 and R2 132 is the feedback node 135. The feedback node 135 also connects to the feedback transistor M9 109. The reference voltage, Vref 129, does not connect to the feedback transistor M9 109 in this case. By adding the resistor R1 131 between Vref and Vfb 135, and the resistor R2 132 between Vfb 135 and ground, then the Vref output voltage becomes Vref (unity gain)*(1+R1/R2).

Figure 2:
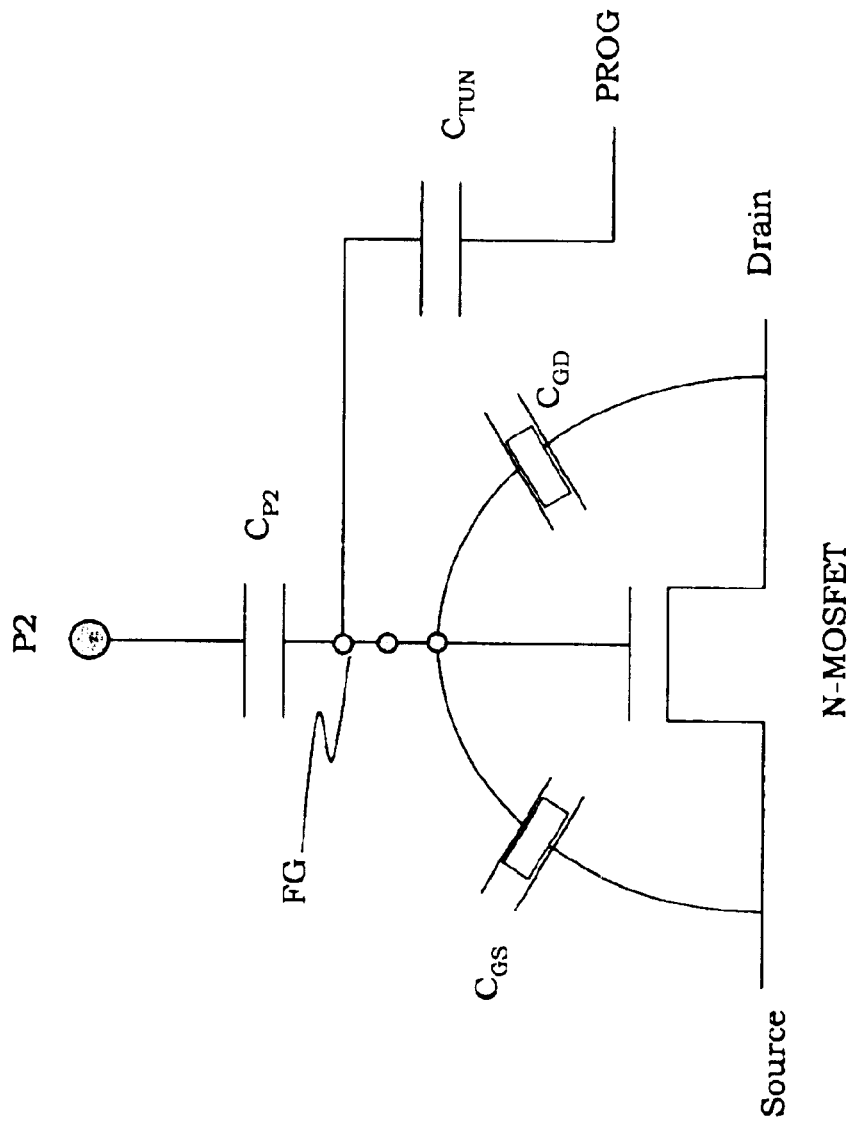
FIG. 2 is a structural diagram illustrating an analog $E^2$ electrical erasable cell in accordance with the present invention.

FIG. 2 is a structural diagram illustrating an analog EEPROM cell 200, such as the one shown in the M3 transistor 103. A feature of an EEPROM cell is the floating gate (FG), which is a conductive piece of polysilicon that keeps charge trapped in between layers of oxide surrounding it. Charge may be added or removed from the floating gate only when very high voltages (~10–16V) are applied across the tunneling window CTUN, which is a wall of oxide much thinner than the surrounding oxide. Under normal operating conditions the surrounding oxide acts as a barrier to charge loss, which is represented in FIG. 2 as a series of capacitors $C_{P2}$, $C_{GS}$, $C_{GD}$, and $C_{TUN}$ between the floating gate, and the Source, Drain, PROG, and P2 nodes.

The charge on a floating gate $Q_{FG}$, using Q=CV, is shown by the following equation.

$$Q_{FG}=(V_{FG}-V_S)C_{GS}+(V_{FG}-V_D)C_{GD}+(V_{FG}-V_{PROG})C_{TUN}+(V_{FG}-V_{P2})C_{P2},$$

where $V_{FG}$ is the voltage potential on the floating gate, $V_S$ is the potential at the source, $V_D$ is the potential at the drain, $V_{PROG}$ is the potential at the PROG, and $V_{P2}$ is the potential of the P2.

In the reference cell, the $V_{P2}$ is grounded.

$$Q'_{FG}=(V'_{FG}-V_S)C_{GS}+(V'_{FG}-V_D)C_{GD}+(V'_{FG}-V_{PROG})C_{TUN}+V'_{FG}C_{P2}$$

$$V'_{FG}=\frac{Q'_{FG}+V'_S C_{GS}+V'_D C_{GD}+V'_{PROG} C_{TUN}}{(C_{GS}+C_{GD}+C_{TUN}+C_{P2})}$$

where $Q'_{FG}$ is the charge on the floating gate of the reference cell, and $V'_{FG}$ is the potential at the FG of the reference cell.

In the storage cell, the voltage potential on the poly 2 gate is equal to the $V_{REF}$ output voltage ($V_{P2}=V_{REF}$).

$$V''_{FG}=\frac{Q''_{FG}+V''_S C_{GS}+V''_D C_{GD}+V''_{PROG} C_{TUN}+V_{REF} C_{P2}}{(C_{GS}+C_{GD}+C_{TUN}+C_{P2})}$$

Since the storage cell M3 103 is placed in a differential pair with the reference cell M4 104, the feedback of this circuit configuration drives the gate of the storage cell M3 103 until the conditions on the underlying MOSFET are identical.

$$V'_{FG}=V''_{FG} \quad V'_S=V''_S \quad V'_D=V''_D \quad V'_{PROG}=V''_{PROG}$$

Almost all terms cancel out, assuming identical layout and matching voltages, and the resulting equation becomes:

$$Q'_{FG}=Q''_{FG}+V_{REF}C_{P2}$$

$$V_{REF}=\frac{Q'_{FG}-Q''_{FG}}{C_{P2}}$$

Therefore, VREF is a function of only two parameters, a differential charge and a capacitance, neither of which is affected by temperature.

Figure 3:
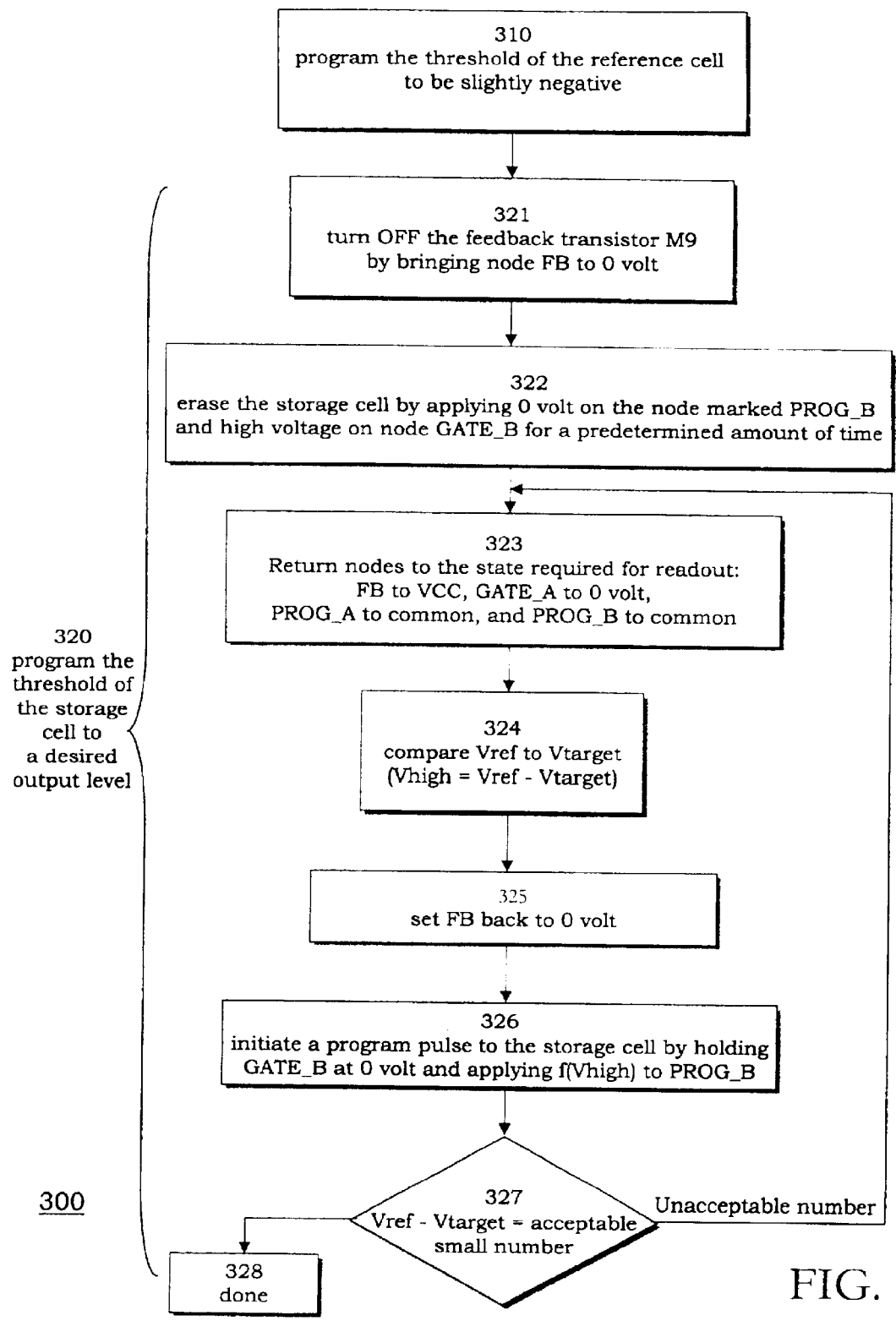
FIG. 3 is a flow diagram illustrating the process for storing a non-volatile analog signal with a precision voltage reference in accordance with the present invention.

FIG. 3 is a flow diagram illustrating the process 300 of storing a non-volatile analog signal for a precision voltage reference. The programming of the non-volatile analog signal storage system 100 to attain the desired reference output voltage is performed in the following manner. First, the threshold of the reference cell is programmed 310 to be slightly negative, such that grounding the gate of the reference cell M4 104 allows some current to pass through. The exact threshold level is not critical (for example, −0.1V to −0.7V will work fine). The programming of the reference cell M4 104 is typically a one-time event, which may be performed in a standard IC manufacturing test flow.

Secondly, the threshold of the storage cell M3 103 is programmed 320 so that the output reaches a desired level. The step 320 is an iterative process described in the following steps. Initially, the feedback in the transistor M9 109 is turned OFF 321 by bringing a node FB to 0V. At a step 322, the process erases 322 the storage cell by applying 0V on a node denoted as PROG_B 121 and a high voltage on a node denoted as GATE_B 122 for a predetermined amount of time. The exact level of high voltage is determined by parameters of the particular semiconductor manufacturing process, but typical numbers range from 15V–18V. During this time, the process 300 holds PROG_A 125 and GATE_A 126 at 0V. The process 300 returns 323 all nodes to the state required for readout: FB to VCC, GATE_A 126 to 0V, and PROG_A 125 and PROG_B 121 to their common potential. At step 324, the process 300 compares Vref to the target voltage (Vtarget). The process 300 sets a value VHIGH that is a function of the delta between Vref and Vtarget. A greater difference in value will result in a greater VHIGH value. At step 325, the process 300 sets the FB node 120 back to 0V in preparation for the following programming step. The process 300 administers 326 a program pulse to the storage cell M3 103 by holding GATE_B at 0V and applying f(VHIGH) to PROG_B. The duration of the pulse width is fixed at a much smaller time than the original erase pulse (for example, smaller by a factor of 1/100). At step 327, the process 300 repeats steps 323, 324, 325, and 326, until Vref−Vtarget is an acceptably small number. At this point, the process 300 is completed in step 328.

In order to maximize the accuracy of the reference output voltage, a proper layout technique should be applied to minimize mismatch among elements. These techniques include: using large geometries among matching elements, and drawing matching transistors within close proximity and in the same orientation. Although these techniques are necessary for high accuracy, they are not conducive for use within arrays.

It can be shown that the reference output obtained from using this invention is a function solely of the difference of charge on the reference cell and storage cell, divided by a gate capacitance. Since neither of these terms is a function of temperature or supply voltage, then it may be concluded that this voltage reference is absolute. This represents a marked change from conventional solutions. In conventional solutions, even when a reference cell and storage cell are used, the reference cell is typically programmed under the same set of conditions as the storage cell.

The above embodiments are only illustrative of the principles of this invention and are not intended to limit the invention to the particular embodiments described. Accordingly, various modifications, adaptations, and combinations of various features of the described embodiments can be practiced without departing from the scope of the invention as set forth in the appended claims.

I claim:

1. An integrated circuit for storing analog signals, comprising:
   a differential amplifier configuration comprising a storage unit having:
      a NV (non-volatile) storage cell (M3);
      a NV (non-volatile) reference cell (M4), coupled to the NV storage cell, wherein the NV storage cell and the NV reference cell form a differential pair in the differential amplifier configuration;
   an input stage having a first transistor (M1), a second transistor (M2), and a third transistor (M3); and
   an output stage having a fourth transistor (M6), and a fifth transistor (M7).

2. The integrated circuit of claim 1, further comprising a sixth transistor (M8) for setting a bias voltage.

3. The integrated circuit of claim 2, further comprising a seventh transistor (M9) for implementing a unity gain configuration.

4. The integrated circuit of claim 3, further comprising a FB signal connected to the seventh transistor, the FB signal being held at a positive rail.

5. A method for storing analog signals, comprising:
first programming a reference cell to be slightly negative by grounding a gate terminal, thereby allowing some electrical current to pass through a gate of the reference cell; and
second programming a threshold of a storage cell.

6. The method of claim 5, wherein the second programming step comprises tuning OFF a feedback transistor by brining a FB node of the feedback transistor to 0 volts.

7. The method of claim 6, wherein the storage cell has a PROG_B node and a GATE_B node, and wherein the second programming step comprises erasing the storage cell by applying 0 volts on the node denoted as PROG_B and a high voltage on the node noted as GATE_B.

8. The method of claim 7, wherein the second programming step comprises returning a FB node in the feedback transistor to Vcc, returning a gate node GATE_A in the reference cell to 0 volts, returning a program node PROG_A to ground, and returning a program node PROG_B to ground.

9. The method of claim 8, wherein the second programming step comprises comparing a Vref voltage to a Vtarget voltage.

10. The method of claim 9, wherein the second programming step comprises setting the FB node in the feedback transistor to 0 volts.

11. The method of claim 10, wherein the second programming step comprises initiating a program pulse to the storage cell by holding GATE_B to 0 volts and applying a high voltage to PROG_B.

12. The method of claim 10, wherein the second programming step comprises determining if a difference between the Vref voltage and the Vtarget voltage is sufficiently small.

* * * * *